(12) United States Patent
She et al.

(10) Patent No.: US 11,015,793 B1
(45) Date of Patent: May 25, 2021

(54) INFINITE MIRROR LIQUID COOLER

(71) Applicant: COOLER MASTER TECHNOLOGY INC., New Taipei (TW)

(72) Inventors: Ling She, Huizhou (CN); Chen-Wei Chen, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/936,740

(22) Filed: Jul. 23, 2020

(30) Foreign Application Priority Data

May 29, 2020 (CN) .......................... 202010482066.4

(51) Int. Cl.
| | |
|---|---|
| *F21K 9/61* | (2016.01) |
| *F21V 29/58* | (2015.01) |
| *H05K 7/20* | (2006.01) |
| *G02B 27/14* | (2006.01) |
| *G02B 17/00* | (2006.01) |
| *F21Y 115/10* | (2016.01) |
| *F21Y 105/18* | (2016.01) |

(52) U.S. Cl.
CPC ............ *F21V 29/59* (2015.01); *G02B 17/004* (2013.01); *G02B 27/144* (2013.01); *H05K 7/20272* (2013.01); *F21Y 2105/18* (2016.08); *F21Y 2115/10* (2016.08)

(58) Field of Classification Search
None
See application file for complete search history.

(56) References Cited

U.S. PATENT DOCUMENTS

2017/0339802 A1* 11/2017 Pan ........................ F28D 15/00
2018/0003360 A1* 1/2018 Wen ...................... F21V 17/101

* cited by examiner

*Primary Examiner* — Elmito Breval
(74) *Attorney, Agent, or Firm* — Greenberg Traurig, LLP

(57) ABSTRACT

A novel infinite mirror liquid cooler device is configured to comprise a printed circuit board (PCB); a logo component; a light-guiding component; a light-guiding component comprising a light-guiding surface; a lower mirror, the lower mirror; a hollow cover; the upper mirror; an upper cover of a pump chamber; an impeller; a lower cover of the pump chamber; a lower base; a pad; and a copper base plate according to some embodiments.

20 Claims, 5 Drawing Sheets

INFINITE MIRROR LIQUID COOLER

RELATED APPLICATION

The present application claims priority to Chinese Pat. App. Ser. No. 202010482066.4, filed May 29, 2020, the entire disclosure of which is hereby incorporated herein by reference.

FIELD OF THE TECHNOLOGY

At least a portion of the present disclosure is related to illuminative devices in general and more particularly but not limited to infinite mirror liquid cooler devices.

BACKGROUND

With carbon emissions at an all-time high, slowing the effects of global warming has become a worldwide priority. To reduce harmful carbon emissions, energy conservation is key. This is the reason behind the industrial-technological surge in the renewable energy sector. Light-emitting diodes (LEDs) pose the advantages: having a small volume, long lifetime, low power consumption, fast starting speed, bountiful color, low heat loss, and high brightness.

In addition to these, with the current environmental materials available, mass production is highly efficient. LEDs presented to be even more of a disruptive technological item when the illumination technology made a breakthrough, allowing LEDs to have thousands of applications including illumination devices, which would thereby replace traditional tungsten lamps, fluorescent lamps, and any other light bulbs. As LED lights require less energy to produce more light, they reduce the demand from power plants, thereby decreasing greenhouse gas emissions and becoming a priority for the future.

Historically, different LED products have been applied to buildings, houses, offices, and vehicles such as cars or motorcycles. The manipulation of LED products is efficient and effective. Changing the mere brightness, color, color density, and blinking state, can drastically affect the atmosphere created by the light.

However, in order to have full control over the contrasts of LED products, there are many LEDs that must be used. When LEDs are used in one power grid, the electrical current can be driven to be below or above the optimal driving current, which can decrease the efficiency severely. In contrast, current lamps have various requirements for shape and optimal illumination states, making them much less flexible to different lighting aesthetics. Flickering lights, and loose connections as a result of short circuits overloading, are all problems that are unresolved.

Furthermore, the current implementations of infinite mirroring systems contain light-guiding components that are far too complex, making them highly susceptible to breakdowns and malfunctions. In short, the shortcomings of both traditional lightings and current LEDs present a multitude of problems.

To overcome both problems, a better designed illuminative device that utilizes simplified light-guiding components with an infinite mirroring layering is needed to prevent the mishaps and malfunctions.

SUMMARY OF DESCRIBED SUBJECT MATTER

In some embodiments, the present disclosure provides various exemplary technically improved infinite mirror liquid cooler devices, methods and systems. For example, in some embodiments, the infinite mirror liquid cooler device is configured to comprise a printed circuit board (PCB) comprising a lighting module, and the lighting module is configured to include a plurality of lighting elements spaced to generate a first light source. In some embodiments, the infinite mirror liquid cooler device is configured to comprise the PCB configured on a base. In some embodiments, the infinite mirror liquid cooler device is configured to comprise the base including an upper base and a lower base. In some embodiments, the infinite mirror liquid cooler device is configured to comprise a logo component configured on the PCB. In some embodiments, the infinite mirror liquid cooler device is configured to comprise a light-guiding component configured on the base to form a light-guiding light source. In some embodiments, the infinite mirror liquid cooler device is configured to comprise the light-guiding component comprising a light-guiding surface. In some embodiments, the infinite mirror liquid cooler device is configured to comprise a lower end of the light-guiding component including a first hollow interruption element, wherein a reflection light source incident on the light-guiding component uniformly scatters to the light-guiding surface to form a ring-shaped light source, and wherein a lower mirror uses the first hollow interruption element to interrupt a part of the reflection light source to form a spaced layered light source. In some embodiments, the infinite mirror liquid cooler device is configured to comprise the lower mirror configured on the logo component. In some embodiments, the lower mirror is configured to include a first light transmissible layer and a first semi-reflective layer. In some embodiments, the first semi-reflective layer is configured to reflect the light-guiding light source to form the reflection light source reflecting mirror images. In some embodiments, the infinite mirror liquid cooler device is configured to comprise a hollow cover configured on the base. In some embodiments, the infinite mirror liquid cooler device is configured to comprise the hollow cover comprising a second hollow interruption element, and the light-guiding component and the lower mirror are configured between the base and the hollow cover. In some embodiments, the infinite mirror liquid cooler device is configured to comprise an upper mirror configured above the lower mirror. In some embodiments, the infinite mirror liquid cooler device is configured to comprise the upper mirror including a second light transmissible layer and a second semi-reflective layer simultaneously reflecting the ring-shaped light source and the spaced layered light source, and the second hollow interruption element interrupts the ring-shaped light source to form a multilayered mirroring light ring. In some embodiments, the infinite mirror liquid cooler device is configured to comprise the upper base configured under the LED PCB. In some embodiments, the infinite mirror liquid cooler device is configured to comprise an upper cover of a pump chamber configured under the upper base. In some embodiments, the infinite mirror liquid cooler device is configured to comprise an impeller configured under the upper cover of the pump chamber. In some embodiments, the infinite mirror liquid cooler device is configured to comprise a lower cover of the pump chamber configured under the impeller. In some embodiments, the infinite mirror liquid cooler device is configured to comprise the lower base configured under the lower cover of the pump chamber. In some embodiments, the infinite mirror liquid cooler device is configured to comprise a pad configured under the lower base. In some embodiments, the infinite mirror liquid cooler device is configured to comprise a copper base plate configured under the pad.

BRIEF DESCRIPTION OF THE DRAWINGS

The embodiments are illustrated by way of example and not limitation in the figures of the accompanying drawings in which like references indicate similar elements.

The accompanying drawings illustrated herein are to provide a further understanding of the disclosed embodiments and constitute a part of the disclosure. Illustrative embodiments of the disclosure and their descriptions are intended to explain the disclosed embodiments rather than unduly limit the embodiments.

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

Figure 1:
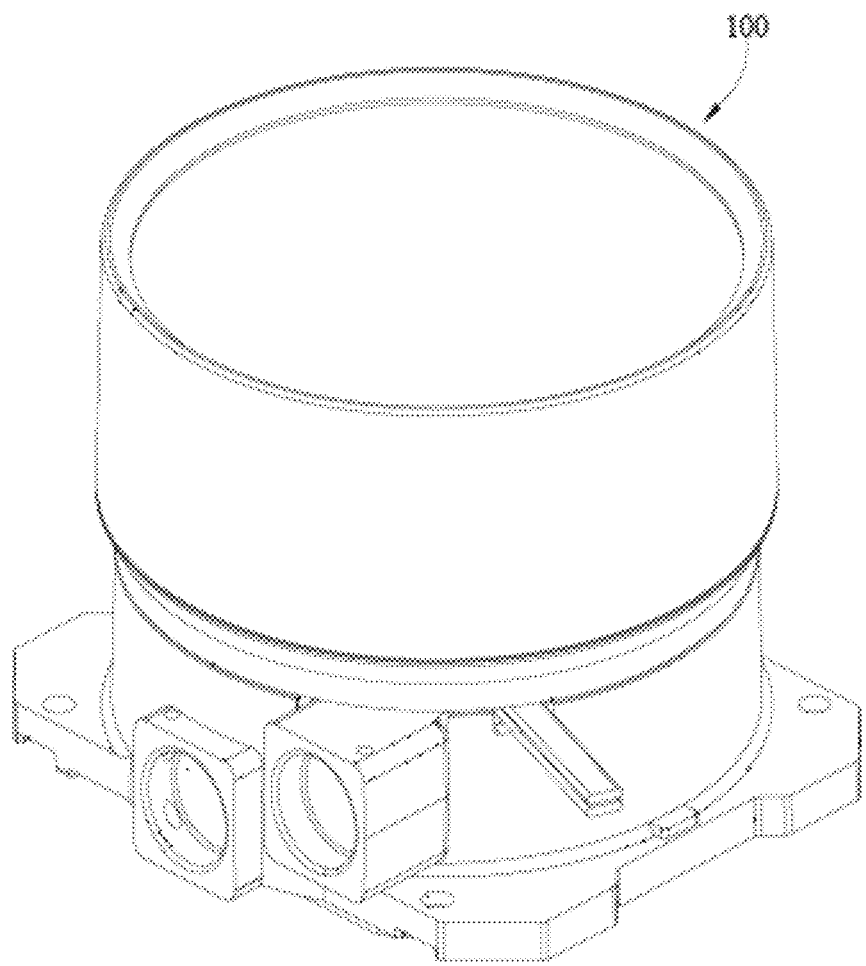

FIG. 1 is a schematic perspective view illustrating an infinite mirror liquid cooler device according to some embodiments.

Figure 2:
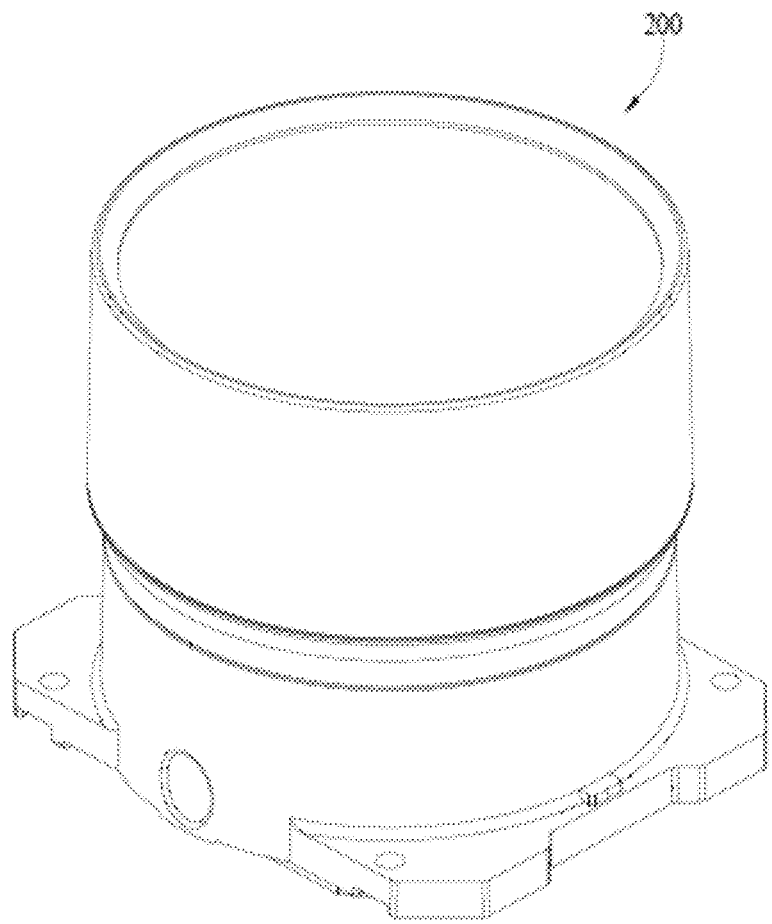

FIG. 2 is another schematic perspective view illustrating an infinite mirror liquid cooler device according to some embodiments.

Figure 3:
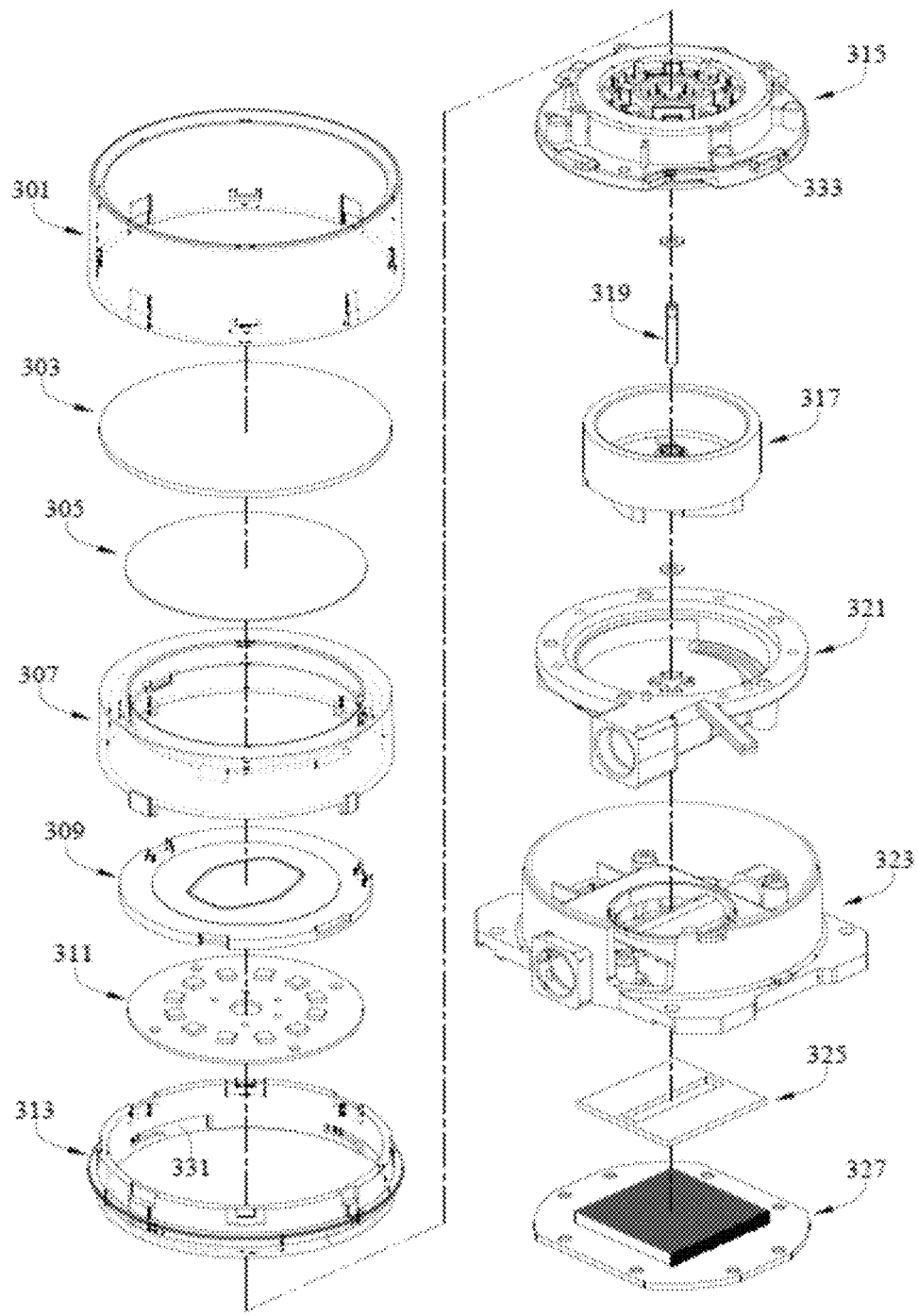

FIG. 3 is a schematic exploded view illustrating an infinite mirror liquid cooler device according to some embodiments.

Figure 4:
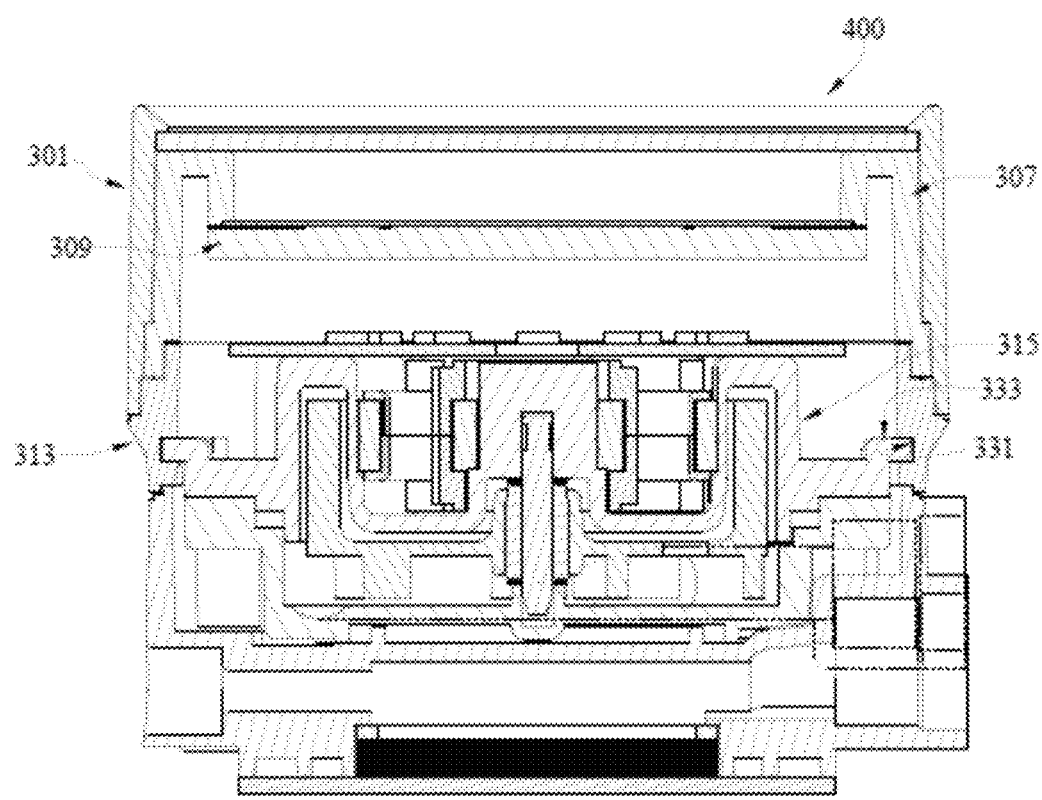

FIG. 4 is a schematic cross-sectional view illustrating an infinite mirror liquid cooler device according to some embodiments.

Figure 5:
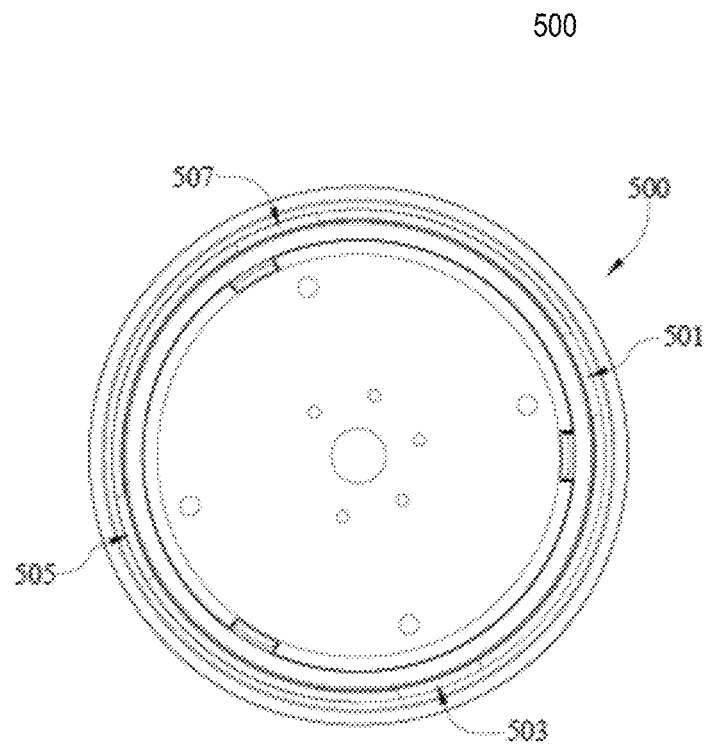

FIG. 5 is a schematic perspective view illustrating assembled components above the upper base connected with the upper base of an infinite mirror liquid cooler device according to some embodiments.

Figure 6:
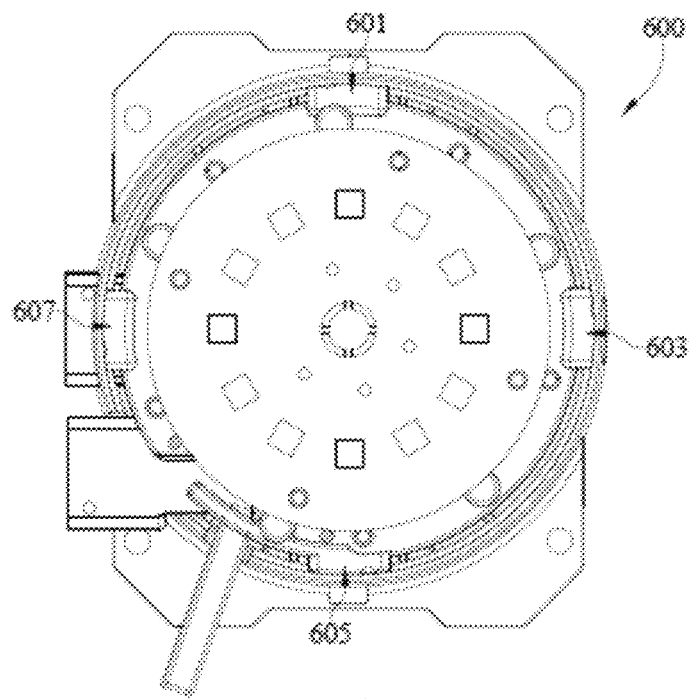

FIG. 6 is a schematic perspective view illustrating assembled components under the PCB component connected with the base of an infinite mirror liquid cooler device according to some embodiments.

DETAILED DESCRIPTION

The following description and drawings are illustrative and are not to be construed as limiting. Numerous specific details are described to provide a thorough understanding. However, in certain instances, well known or conventional details are not described to avoid obscuring the description. References to one or an embodiment in the present disclosure are not necessarily references to the same embodiment; and, such references mean at least one.

Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

In addition, the term "based on" is not exclusive and allows for being based on additional factors not described, unless the context clearly dictates otherwise. In addition, throughout the specification, the meaning of "a," "an," and "the" includes plural references. The meaning of "in" includes "in" and "on."

FIG. 1 is a schematic perspective view illustrating an infinite mirror liquid cooler device (100) according to some embodiments. FIG. 2 is another schematic perspective view illustrating an infinite mirror liquid cooler device (200) according to some embodiments. FIG. 3 is a schematic exploded view illustrating an infinite mirror liquid cooler device according to some embodiments. For example, in some embodiments, the infinite mirror liquid cooler device is configured to include a hollow cover (301), an upper mirror (303), a lower mirror (305), a light-guiding component (307), a logo component (309), a printed circuit board (PCB) (311), an upper base (313), an upper cover of a pump chamber (315), an impeller (317), a shaft (319), a lower cover of the pump chamber (321), a lower base (323), a pad (325), and a copper base plate (327).

In some embodiments, the infinite mirror liquid cooler device is configured to include a printed circuit board (PCB) (311). For example, the printed circuit board (PCB) (311) is configured to include a lighting module according to some embodiments. In some embodiments, a lighting module is configured to include a plurality of lighting elements spaced to generate a light source.

For example, in some embodiments the lighting module is configured to include a light-emitting diode (LED). In some embodiments, the lighting module is configured to include an organic light-emitting diode (OLED). In some embodiments, the lighting module is configured to include a luminescent paper. In some embodiments, the lighting module is configured to include a light-emitting diode (LED), an organic light-emitting diode (OLED), a luminescent paper, or a combination thereof.

In some embodiments, the PCB (311) is configured on a base. For example, in some embodiments, the base includes an upper base (313) and a lower base (323). In some embodiments, the infinite mirror liquid cooler device is configured to include a logo component (309). For example, in some embodiments, the logo component (309) is configured on the PCB (311). In some embodiments, the logo component (309) can include a text. In some embodiments, the logo component (309) can include a number. In some embodiments, the logo component (309) can include a symbol. In some embodiments, the logo component (309) can include a geometric pattern. In some embodiments, the logo component (309) can include a totem. In some embodiments, the logo component (309) can include a trademark. In some embodiments, the logo component (309) can include a text, a number, a symbol, a geometric pattern, a totem, a trademark, or a combination thereof.

In some embodiments, the logo component (309) can include transparent Polycarbonates (PC). In other embodiments, the logo component (309) can include spray paints. For example, in some embodiments, the logo component (309) can include laser carvings. In some embodiments, the logo component is configured to include one or more transparent Polycarbonates (PC), spray paints, laser carvings, or a combination thereof.

In some embodiments, the infinite mirror liquid cooler device is configured to include a light-guiding component (307). For example, in some embodiments, the light-guiding component (307) can be configured on the base. In some embodiments, the light-guiding component (307) can form a light guiding light source. For example, in some embodiments, the light-guiding component (307) is configured to comprise a light-guiding surface. In some embodiments, a lower end of the light-guiding component (307) is configured to include a first hollow interruption element. For example, in some embodiments, a reflection light source incident on the light-guiding component (307) can uniformly scatter to the light-guiding surface to form a ring-shaped light source. In some embodiments, the infinite mirror liquid cooler device is configured to comprise a lower mirror (305) configured to use the first hollow interruption element to interrupt a part of the reflection light source to form a spaced layered light source.

In some embodiments, the infinite mirror liquid cooler device is configured to comprise the light guiding component (307) comprising Polycarbonates. In some embodiments, the infinite mirror liquid cooler device is configured to comprise the light guiding component (307) comprising Titanium dioxide. In some embodiments, the infinite mirror liquid cooler device is configured to comprise the light guiding component (307) comprising Polycarbonates, Titanium dioxide, or a combination thereof.

In some embodiments, the infinite mirror liquid cooler device is configured to comprise a lower mirror (305). For example, in some embodiments, the lower mirror (305) is configured on the logo component (309) by a coating or plating process. In some embodiments, the lower mirror (305) includes a first light transmissible layer and a first semi-reflective layer, and the first semi-reflective layer can reflect the light-guiding light source to form the reflection light source reflecting mirror images.

In some embodiments, the infinite mirror liquid cooler device is configured to comprise a hollow cover (301). For example, in some embodiments, the hollow cover (301) is configured on the base (313, 323). In some embodiments, the hollow cover (301) is configured to comprise a second hollow interruption element. For example, in some embodiments, the light-guiding component (307) and the lower mirror (305) are configured between the base (313, 323) and the hollow cover (301).

In some embodiments, the hollow cover (301) includes Acrylonitrile Butadiene Styrene (ABS) or Polystyrene (PS). In some embodiments, the hollow cover (301) includes Acrylonitrile Butadiene Styrene (ABS) or Polystyrene (PS) in black color.

In some embodiments, the infinite mirror liquid cooler device is configured to comprise an upper mirror (303). For example, in some embodiments, the upper mirror (303) is configured above the lower mirror (305). In some embodiments, the upper mirror (303) includes a second light transmissible layer and a second semi-reflective layer simultaneously reflecting the ring-shaped light source and the spaced layered light source. For example, in some embodiments, the second hollow interruption element of the hollow cover (301) interrupts the ring-shaped light source to form a multilayered mirroring light ring.

In some embodiments, the infinite mirror liquid cooler device is configured to comprise one or more infinite mirrors (303, 305) comprising a temperature-sensitive film. For example, in some embodiments, the upper mirror (303) is configured to comprise a temperature-sensitive film. In some embodiments, the lower mirror (305) is configured to comprise a temperature-sensitive film. In some embodiments, both the upper mirror and the lower mirror are configured to comprise temperature-sensitive films. For example, in some embodiments, with the temperature-sensitive film, when a change of the ambient temperature is sensed by the temperature-sensitive film, a color of the temperature-sensitive film is correspondingly changed.

In some embodiments, the infinite mirror liquid cooler device is configured to comprise an upper base (313). For example, in some embodiments, the upper base (313) is configured under the PCB (311).

In some embodiments, the infinite mirror liquid cooler device is configured to comprise an upper cover of a pump chamber (315). For example, in some embodiments, the upper cover (315) is configured under the upper base (313).

In some embodiments, the upper base (313) is configured to include one or more first installation elements (331). For example, in some embodiments, the upper cover of the pump chamber (315) includes one or more second installation elements (333). In some embodiments, the upper base (313) is configured to be fixed on the upper cover of the pump chamber (315) by the one or more first installation elements (331) and the one or more second installation elements (333). For example, in some embodiments, the one or more first installation elements (331) can be sliding doors (331). In some embodiments, the one or more second installation elements (333) can be bulge outwards (333).

In some embodiments, the infinite mirror liquid cooler device is configured to comprise an impeller (317). For example, in some embodiments, the impeller (317) is configured under the upper cover of the pump chamber (315). In some embodiments, the infinite mirror liquid cooler device includes a shaft (319). For example, in some embodiments, the shaft (319) is at the center of the impeller (317).

In some embodiments, the infinite mirror liquid cooler device is configured to comprise a lower cover of the pump chamber (321). For example, in some embodiments, the lower cover of the pump chamber (321) is configured under the impeller (317).

In some embodiments, the infinite mirror liquid cooler device is configured to comprise a lower base (323). For example, in some embodiments, the lower base (323) is configured under the lower cover of the pump chamber (321).

In some embodiments, the infinite mirror liquid cooler device is configured to comprise a pad (325). For example, in some embodiments, the pad (325) is configured under the lower base (323).

In some embodiments, the infinite mirror liquid cooler device is configured to comprise a copper base plate (327). In some embodiments, the copper base plate (327) is configured under the pad (325).

FIG. 4 is a schematic cross-sectional view illustrating an infinite mirror liquid cooler device (400) according to some embodiments. For example, in some embodiments, the infinite mirror liquid cooler device (400) is configured to comprise a hollow cover (301), a logo component (309), an upper cover of a pump chamber (313), a light-guiding component (307), a sliding door (331), and a bulge outward (333).

FIG. 5 is a schematic perspective view illustrating assembled components above the upper base (313) connected with the upper base of an infinite mirror liquid cooler device (400) according to some embodiments. For example, in some embodiments, the assembled components (500)

above the upper base (313) connected with the upper base of an infinite mirror liquid cooler device (400) are configured to comprise a hollow cover (301), an upper mirror (303), a lower mirror (305), a light-guiding component (307), a logo component (309), a printed circuit board (PCB) (311), an upper base (313) and sliding doors (501, 503, 505, 507).

FIG. 6 is a schematic perspective view illustrating assembled components (600) under a PCB component (311) connected with the base of an infinite mirror liquid cooler device according to some embodiments. For example, in some embodiments, the assembled components (600) under a PCB component (311) connected with the base of an infinite mirror liquid cooler device (400) are configured to comprise a printed circuit board (PCB) (311), an upper base (313), an upper cover of a pump chamber (315), an impeller (317), a shaft (319), a lower cover of the pump chamber (321), a lower base (323), a pad (325), a copper base plate (327), and bulge outwards (601, 603, 605, 607).

In the foregoing specification, the disclosure has been described with reference to specific exemplary embodiments thereof. It will be evident that various modifications may be made thereto without departing from the broader spirit and scope as set forth in the following numbered clauses written in the claim format. The specification and drawings are, accordingly, to be regarded in an illustrative sense rather than a restrictive sense.

At least some aspects of the present disclosure will now be described with reference to the following numbered clauses written in the claim format.

1. An apparatus, comprising:
    an infinite mirror liquid cooler device, comprising:
    a printed circuit board (PCB) comprising a lighting module, the lighting module including a plurality of lighting elements spaced to generate a first light source, the PCB configured on a base, the base including an upper base and a lower base;
    a logo component configured on the PCB;
    a light-guiding component configured on the base, forming a light-guiding light source, the light-guiding component comprising a light-guiding surface;
    a lower mirror configured on the logo component, the lower mirror including a first light transmissible layer and a first semi-reflective layer, the first semi-reflective layer reflecting the light-guiding light source to form a reflection light source reflecting mirror images;
    a hollow cover configured on the base, the hollow cover comprising a first hollow interruption element, wherein the light-guiding component and the lower mirror are configured between the base and the hollow cover;
    an upper mirror configured above the lower mirror, the upper mirror including a second light transmissible layer and a second semi-reflective layer simultaneously reflecting a ring-shaped light source and a spaced layered light source, wherein the first hollow interruption element interrupts the ring-shaped light source to form a multilayered mirroring light ring;
    the upper base configured under the PCB;
    an upper cover of a pump chamber configured under the upper base;
    an impeller configured under the upper cover of the pump chamber;
    a lower cover of the pump chamber configured under the impeller;
    the lower base configured under the lower cover of the pump chamber;
    a pad configured under the lower base; and
    a copper base plate configured under the pad;

2. The apparatus of claim 1, wherein the lighting module includes a light-emitting diode (LED), an organic light-emitting diode (OLED), a luminescent paper, or a combination thereof.

3. The apparatus of claim 1, wherein the light-guiding component further comprising:
    a lower end of the light-guiding component including a second hollow interruption element,
    wherein the reflection light source incident on the light-guiding component uniformly scatters to the light-guiding surface to form the ring-shaped light source, and
    wherein the lower mirror uses the second hollow interruption element to interrupt a part of the reflection light source to form the spaced layered light source.

4. The apparatus of claim 1, wherein the logo component includes a text, a number, a symbol, a geometric pattern, a totem, or a combination thereof.

5. The apparatus of claim 1, wherein an infinite mirror further comprising a temperature-sensitive film, the infinite mirror including the upper mirror, the lower mirror, or a combination thereof.

6. The apparatus of claim 1, further comprising:
    one or more first installation elements configured on the upper base.

7. The apparatus of claim 1, further comprising:
    one or more second installation elements configured on the upper cover of the pump chamber.

8. The apparatus of claim 6, wherein the upper base is fixed on the upper cover of the pump chamber by the one or more first installation elements and the one or more second installation elements.

9. The apparatus of claim 1, wherein the light guiding component including Polycarbonates, Titanium dioxide, or a combination thereof.

10. The apparatus of claim 1, wherein the logo component including one or more transparent Polycarbonates (PC), spray paints, laser carvings, or a combination thereof.

11. The apparatus of claim 1, wherein the upper mirror including one or more glasses, vacuum plating, or a combination thereof.

12. The apparatus of claim 1, wherein the hollow cover including Acrylonitrile Butadiene Styrene (ABS).

13. An infinite mirror liquid cooler device, comprising:
    a printed circuit board (PCB) comprising a lighting module, the lighting module including a plurality of lighting elements spaced to generate a first light source, the PCB configured on a base, the base including an upper base and a lower base;
    a logo component configured on the PCB;
    a light-guiding component configured on the base, forming a light-guiding light source, the light-guiding component comprising a light-guiding surface;
    a lower mirror configured on the logo component, the lower mirror including a first light transmissible layer and a first semi-reflective layer, the first semi-reflective layer reflecting the light-guiding light source to form a reflection light source reflecting mirror images;
    a hollow cover configured on the base, the hollow cover comprising a first hollow interruption element, wherein the light-guiding component and the lower mirror are configured between the base and the hollow cover;
    an upper mirror configured above the lower mirror, the upper mirror including a second light transmissible layer and a second semi-reflective layer simultaneously reflecting a ring-shaped light source and a spaced layered light source, wherein the first hollow interruption element interrupts the ring-shaped light source to form a multilayered mirroring light ring;
the upper base configured under the PCB;
an upper cover of a pump chamber configured under the upper base;
an impeller configured under the upper cover of the pump chamber;
a lower cover of the pump chamber configured under the impeller;
the lower base configured under the lower cover of the pump chamber;
a pad configured under the lower base; and
a copper base plate configured under the pad.

14. The infinite mirror liquid cooler device of claim 13, wherein the lighting module includes a light-emitting diode (LED), an organic light-emitting diode (OLED), a luminescent paper, or a combination thereof.

15. The infinite mirror liquid cooler device of claim 13, wherein the light-guiding component further comprising:
    a lower end of the light-guiding component including a second hollow interruption element,
    wherein the reflection light source incident on the light-guiding component uniformly scatters to the light-guiding surface to form the ring-shaped light source, and
    wherein the lower mirror uses the second hollow interruption element to interrupt a part of the reflection light source to form the spaced layered light source.

16. The infinite mirror liquid cooler device of claim 13, wherein the logo component includes a text, a number, a symbol, a geometric pattern, a totem, or a combination thereof.

17. The infinite mirror liquid cooler device of claim 13, wherein an infinite mirror further comprising a temperature-sensitive film, the infinite mirror including the upper mirror, the lower mirror, or a combination thereof.

18. The infinite mirror liquid cooler device of claim 13, further comprising:
    one or more first installation elements configured on the upper base;
    one or more second installation elements configured on the upper cover of the pump chamber, wherein the upper base is fixed on the upper cover of the pump chamber by the one or more first installation elements and the one or more second installation elements.

19. The infinite mirror liquid cooler device of claim 13, wherein the light guiding component including Polycarbonates, Titanium dioxide, or a combination thereof.

20. The infinite mirror liquid cooler device of claim 13, wherein the hollow cover including Acrylonitrile Butadiene Styrene (ABS) or Polystyrene (PS).

While one or more embodiments of the present disclosure have been described, it is understood that these embodiments are illustrative only, and not restrictive, and that many modifications may become apparent to those of ordinary skill in the art, including that various embodiments of the inventive methodologies, the inventive systems/platforms, and the inventive devices described herein can be utilized in any combination with each other.

Further still, the various steps may be carried out in any desired order (and any desired steps may be added and/or eliminated).

What is claimed is:

1. An apparatus, comprising:
an infinite mirror liquid cooler device, comprising:
    a printed circuit board (PCB) comprising a lighting module, the lighting module including a plurality of lighting elements spaced to generate a first light source, the PCB configured on a base, the base including an upper base and a lower base;
    a logo component configured on the PCB;
    a light-guiding component configured on the base, forming a light-guiding light source;
    a lower mirror configured on the logo component, the lower mirror including a first light transmissible layer and a first semi-reflective layer, the first semi-reflective layer reflecting the light-guiding light source to form a reflection light source reflecting mirror images;
    a hollow cover configured on the base, the hollow cover comprising a first hollow interruption element, wherein the light-guiding component and the lower mirror are configured between the base and the hollow cover;
    an upper mirror configured above the lower mirror, the upper mirror including a second light transmissible layer and a second semi-reflective layer simultaneously reflecting a ring-shaped light source and a spaced layered light source, wherein the first hollow interruption element interrupts the ring-shaped light source to form a multilayered mirroring light ring;
    the upper base configured under the PCB;
    an upper cover of a pump chamber configured under the upper base;
    an impeller configured under the upper cover of the pump chamber;
    a lower cover of the pump chamber configured under the impeller;
    the lower base configured under the lower cover of the pump chamber;
    a pad configured under the lower base; and
    a copper base plate configured under the pad.

2. The apparatus of claim 1, wherein the lighting module includes a light-emitting diode (LED), an organic light-emitting diode (OLED), a luminescent paper, or a combination thereof.

3. The apparatus of claim 1, wherein the light-guiding component further comprising:
    a lower end of the light-guiding component including a second hollow interruption element,
    wherein the reflection light source incident on the light-guiding component uniformly scatters to the light-guiding surface to form the ring-shaped light source, and
    wherein the lower mirror uses the second hollow interruption element to interrupt a part of the reflection light source to form the spaced layered light source.

4. The apparatus of claim 1, wherein the logo component includes a text, a number, a symbol, a geometric pattern, a totem, or a combination thereof.

5. The apparatus of claim 1, wherein an infinite mirror further comprising a temperature-sensitive film, the infinite mirror including the upper mirror, the lower mirror, or a combination thereof.

6. The apparatus of claim 1, further comprising:
    one or more first installation elements configured on the upper base.

7. The apparatus of claim 6, wherein the upper base is fixed on the upper cover of the pump chamber by the one or more first installation elements and the one or more second installation elements.

8. The apparatus of claim 1, further comprising:
    one or more second installation elements configured on the upper cover of the pump chamber.

9. The apparatus of claim 1, wherein the light guiding component including Polycarbonates, Titanium dioxide, or a combination thereof.

10. The apparatus of claim 1, wherein the logo component including one or more transparent Polycarbonates (PC), spray paints, laser carvings, or a combination thereof.

11. The apparatus of claim 1, wherein the upper mirror including one or more glasses, vacuum plating, or a combination thereof.

12. The apparatus of claim 1, wherein the hollow cover including Acrylonitrile Butadiene Styrene (ABS) or Polystyrene (PS).

13. An infinite mirror liquid cooler device, comprising:
a printed circuit board (PCB) comprising a lighting module, the lighting module including a plurality of lighting elements spaced to generate a first light source, the PCB configured on a base, the base including an upper base and a lower base;
a logo component configured on the PCB;
a light-guiding component configured on the base, forming a light-guiding light source, the light-guiding component comprising a light-guiding surface;
a lower mirror configured on the logo component, the lower mirror including a first light transmissible layer and a first semi-reflective layer, the first semi-reflective layer reflecting the light-guiding light source to form a reflection light source reflecting mirror images;
a hollow cover configured on the base, the hollow cover comprising a first hollow interruption element, wherein the light-guiding component and the lower mirror are configured between the base and the hollow cover;
an upper mirror configured above the lower mirror, the upper mirror including a second light transmissible layer and a second semi-reflective layer simultaneously reflecting a ring-shaped light source and a spaced layered light source, wherein the first hollow interruption element interrupts the ring-shaped light source to form a multilayered mirroring light ring;
the upper base configured under the PCB;
an upper cover of a pump chamber configured under the upper base;
an impeller configured under the upper cover of the pump chamber;
a lower cover of the pump chamber configured under the impeller;
the lower base configured under the lower cover of the pump chamber;
a pad configured under the lower base; and
a copper base plate configured under the pad.

14. The infinite mirror liquid cooler device of claim 13, wherein the lighting module includes a light-emitting diode (LED), an organic light-emitting diode (OLED), a luminescent paper, or a combination thereof.

15. The infinite mirror liquid cooler device of claim 13, wherein the light-guiding component further comprising:
a lower end of the light-guiding component including a second hollow interruption element,
wherein the reflection light source incident on the light-guiding component uniformly scatters to the light-guiding surface to form the ring-shaped light source, and
wherein the lower mirror uses the second hollow interruption element to interrupt a part of the reflection light source to form the spaced layered light source.

16. The infinite mirror liquid cooler device of claim 13, wherein the logo component includes a text, a number, a symbol, a geometric pattern, a totem, or a combination thereof.

17. The infinite mirror liquid cooler device of claim 13, wherein an infinite mirror further comprising a temperature-sensitive film, the infinite mirror including the upper mirror, the lower mirror, or a combination thereof.

18. The infinite mirror liquid cooler device of claim 13, further comprising:
one or more first installation elements configured on the upper base;
one or more second installation elements configured on the upper cover of the pump chamber, wherein the upper base is fixed on the upper cover of the pump chamber by the one or more first installation elements and the one or more second installation elements.

19. The infinite mirror liquid cooler device of claim 13, wherein the light guiding component including Polycarbonates, Titanium dioxide, or a combination thereof.

20. The infinite mirror liquid cooler device of claim 13, wherein the hollow cover including Acrylonitrile Butadiene Styrene (ABS) or Polystyrene (PS).

* * * * *